United States Patent
Cadloni et al.

(10) Patent No.: US 10,878,910 B2
(45) Date of Patent: Dec. 29, 2020

(54) MEMORY START VOLTAGE MANAGEMENT

(71) Applicant: Micron Technology, Inc., Boise, ID (US)

(72) Inventors: Gerald L. Cadloni, Longmont, CO (US); Steve Kientz, Westminster, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/566,713

(22) Filed: Sep. 10, 2019

(65) Prior Publication Data

US 2020/0005870 A1    Jan. 2, 2020

Related U.S. Application Data

(63) Continuation of application No. 15/967,265, filed on Apr. 30, 2018.

(51) Int. Cl.
  *G11C 16/08*    (2006.01)
  *G11C 16/20*    (2006.01)
  *G11C 16/30*    (2006.01)

(52) U.S. Cl.
  CPC ............ *G11C 16/08* (2013.01); *G11C 16/20* (2013.01); *G11C 16/30* (2013.01)

(58) Field of Classification Search
  CPC .......... G11C 16/08; G11C 16/30; G11C 16/20
  See application file for complete search history.

(56) References Cited

U.S. PATENT DOCUMENTS

| | | |
|---|---|---|
| 2009/0310422 A1 | 12/2009 | Edahiro et al. |
| 2010/0008138 A1 | 1/2010 | Wang |
| 2010/0157641 A1 | 6/2010 | Shalvi et al. |
| 2010/0214853 A1 | 8/2010 | Kang |
| 2011/0085379 A1 | 4/2011 | Kim |
| 2015/0029796 A1 | 1/2015 | Choi et al. |
| 2016/0180958 A1* | 6/2016 | Raghunathan ....... G11C 29/021 365/185.24 |
| 2018/0018091 A1 | 1/2018 | Shin et al. |
| 2018/0232268 A1* | 8/2018 | Dosluoglu ............ G06F 11/076 |

OTHER PUBLICATIONS

International Application No. PCT/US2019/025255—International Search Report and Written Opinion, dated Jul. 23, 2019, 13 pages.

* cited by examiner

*Primary Examiner* — Mohammed A Bashar
(74) *Attorney, Agent, or Firm* — Perkins Coie LLP

(57) ABSTRACT

A system includes a memory device storing a set of start voltage values, wherein the set of start voltage values each represent voltage levels used to initially store charges in performing operations to corresponding one or more memory locations of the memory device; and a processing device, operatively coupled to the memory device, to: determine whether a quantity of start voltage values in the set of start voltage values stored in the memory device meets a threshold; modify the set of start voltage values stored in the memory device to remove one or more start voltage values from the set in response to a determination that the quantity of start voltage values in the set meets the threshold; and add a new start voltage value to the modified set of start voltage values.

29 Claims, 5 Drawing Sheets

MEMORY START VOLTAGE MANAGEMENT

CROSS-REFERENCE TO RELATED APPLICATIONS

This application is a continuation of U.S. application Ser. No. 15/967,265, filed Apr. 30, 2018; which is incorporated herein by reference in its entirety.

TECHNICAL FIELD

The disclosed embodiments relate to memory systems, and, in particular, to memory start voltage management.

BACKGROUND

Memory systems can employ memory devices to store and access information. The memory devices can include volatile memory devices, non-volatile memory devices, or a combination device. The non-volatile memory devices can include flash memory employing "NAND" technology or logic gates, "NOR" technology or logic gates, or a combination thereof.

Memory devices, such as flash memory, utilize electrical energy, along with corresponding threshold levels or processing voltage levels, to store and access data. However, the performance or characteristics of the flash memory devices change or degrade over time or usage. The change in performance or characteristics conflicts with the threshold or processing voltage levels over time, leading to errors and other performance issues.

DETAILED DESCRIPTION

Aspects of the present disclosure are directed to managing start voltages of a memory system. An example of a memory system is a storage system, such as a solid-state drive (SSD). In general, a host system can utilize a memory system that includes one or more memory devices. The memory devices can include non-volatile memory devices, such as, for example, negative-and (NAND). The host system can provide write requests to store data at the memory devices of the memory system and can provide read requests to retrieve data stored at the memory system. For an initial write operation, a memory device can store charge to the memory cells of a particular memory location for the write operation. The memory device can store programming start voltages based on the initial write operation to that particular memory location (e.g., a memory block, a word line, or a combination thereof). Traditional memory devices can each utilize a memory-block list to track the start voltage levels that are used to program corresponding memory blocks/word lines. For subsequent programming events (e.g., write operations) to that particular memory location, the memory system (e.g., SSD) can refer to the stored programming start voltages, which can result in improved programming time ("$T_{prog}$") performance. However, some traditional memory systems may be limited in the number of programming start voltages that can be stored. A conventional memory-block list can have a maximum capacity for tracking a maximum number of start voltage levels. Once the block list becomes full, subsequent open block streams (e.g., a set/sequence of write/programming operations that occur to a corresponding block, word line, etc.) may not benefit from tracking of the start voltage level. Accordingly, the subsequent open block streams of a traditional memory system may experience poorer $T_{prog}$ performance.

Aspects of the present disclosure address the above and other deficiencies by dynamically managing the memory-block list for the memory devices and freeing capacity on the memory-block list to track new start voltage levels. Aspects of the present disclosure describe managing the memory-block list, for example, based on tracking the most recently used open block streams. Aspects of the present disclosure describe managing the memory-block list, for example, based on determining whether the memory-block is near and/or has reached maximum capacity, and in response, one or more entries in the memory-block list to free up capacity.

Figure 1:
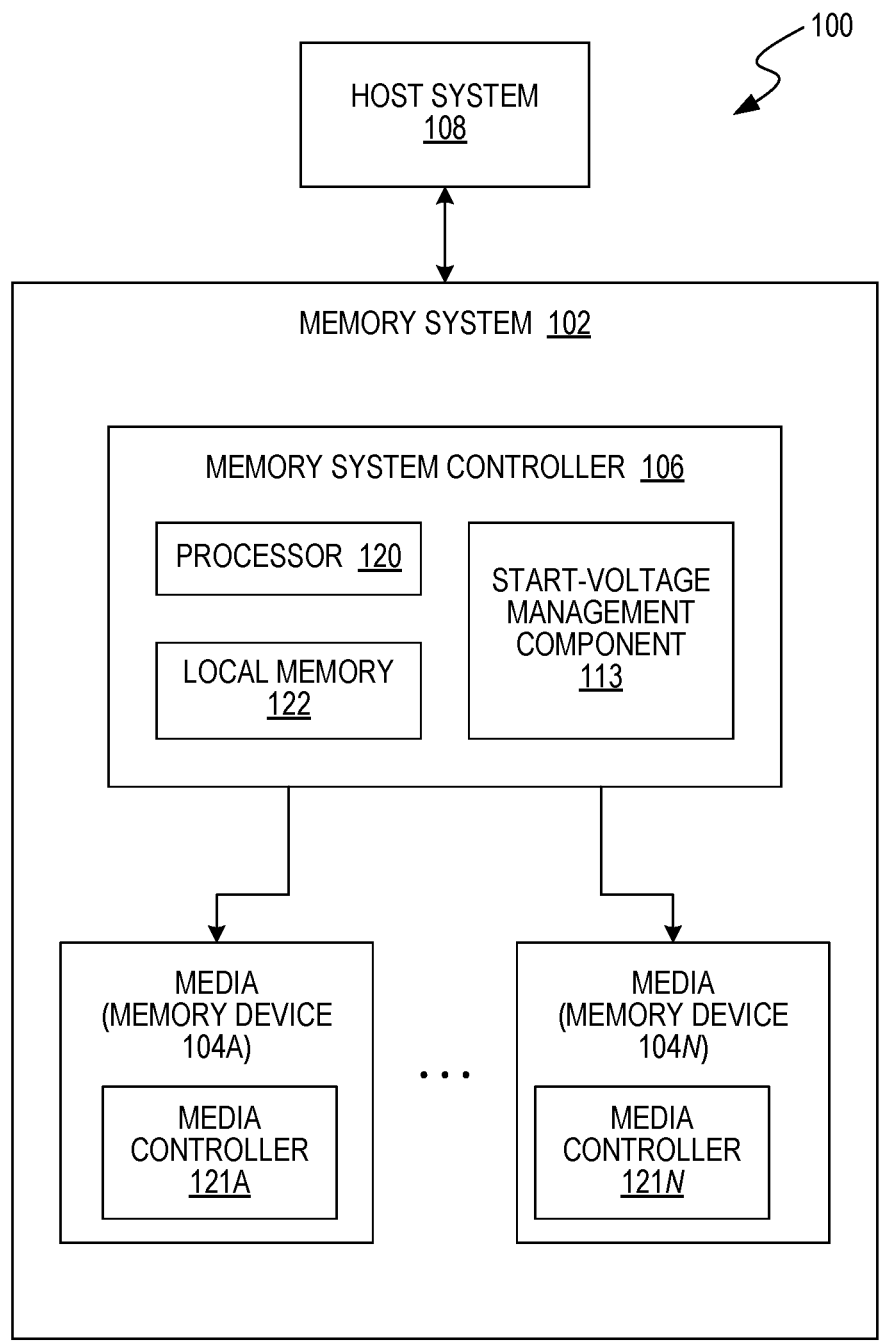
FIG. 1 illustrates an example computing environment that includes a storage system in accordance with some embodiments of the present disclosure.

FIG. 1 is a block diagram of an example computing system 100 that includes a memory system 102, in accordance with some embodiments of the present disclosure. The memory system 102 can include media, such as memory devices 104A to 104N. The memory devices 104A to 104N can be volatile memory devices, non-volatile memory devices, or a combination of such. In some embodiments, the memory system 102 is a storage system. An example of a storage system is a solid-state drive (SSD). In general, the computing system 100 can include a host system 108 that uses the memory system 102. For example, the host system 108 may write data to the memory system 102 and read data from the memory system 102.

The host system 108 can be a computing device such as a desktop computer, laptop computer, network server, mobile device, or such computing device that includes a memory and a processing device. The host system 108 can include or be coupled to the memory system 102 so that the host system 108 can read data from or write data to the memory system 102. The host system 108 can be coupled to the memory system 102 via a physical host interface. As used herein, "coupled to" generally refers to a connection between components, which may be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 108 and the memory system 102. The host system 108 can further utilize an NVM Express (NVMe) interface to access the memory devices 104A to 104N when the memory system 102 is coupled with the host system 108 by the PCIe interface. The interface can provide an interface for passing control, address, data, and other signals between the memory system 102 and the host system 108.

The memory devices 104A to 104N can include any combination of the different types of non-volatile memory devices and/or volatile memory devices. An example of non-volatile memory devices includes a negative-and (NAND) type flash memory. Each of the memory devices 104A to 104N can include one or more arrays of memory cells such as single level cells (SLCs), multi-level cells (MLCs) (e.g., triple level cells (TLCs), or quad-level cells (QLCs)). In some embodiments, a particular memory device includes multiple types of arrays of memory cells, such as, for example both SLC memory cells and MLC memory cells. Each of the memory cells can store one or more bits of data (e.g., data blocks) used by the host system 108. Although non-volatile memory devices such as NAND type flash memory are described, the memory devices 104A to 104N can be based on any other type of non-volatile memory or volatile memory. For example, the memory devices 104A to 104N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 104A to 104N can be grouped as memory pages or data blocks that can refer to a unit of the memory device used to store data.

The memory system controller 106 can communicate with the memory devices 104A to 104N to perform operations such as reading data, writing data, or erasing data at the memory devices 104A to 104N and other such operations. Furthermore, the memory system controller 106 can include hardware such as one or more integrated circuits and/or discrete components, a processing device, a buffer memory, software such as firmware or other instructions, or a combination thereof. In general, the memory system controller 106 can receive commands or operations from the host system 108 and can convert the commands or operations into instructions or appropriate commands to achieve the desired access to the memory devices 104A to 104N. The memory system controller 106 can be responsible for other operations such as wear leveling operations, garbage collection operations, error detection and error-correcting code (ECC) operations, encryption operations, caching operations, and address translations between a logical block address and a physical block address that are associated with the memory devices 104A to 104N. The memory system controller 106 can further include host interface circuitry to communicate with the host system 108 via the physical host interface. The host interface circuitry can convert the commands received from the host system into command instructions to access the memory devices 104A to 104N as well as convert responses associated with the memory devices 104A to 104N into information for the host system 108.

The memory devices 104A to 104N can include one or more memory components (e.g., channels, packages, dies, planes, blocks, pages, cells, etc.) configured to store and provide access to data. For example, the memory devices 104A to 104N can include an array of memory cells that each store data in a charge storage structure. The memory cells can include, for example, floating gate, charge trap, phase change, ferroelectric, magnetoresitive, and/or other suitable storage elements configured to store data persistently or semi-persistently. The memory cells can be one-transistor memory cells that can be programmed to a target state to represent information. For instance, electric charge can be placed on, or removed from, the charge storage structure (e.g., the charge trap or the floating gate) of the memory cell to program the cell to a particular data state.

The memory system controller 106 can be a microcontroller, special purpose logic circuitry (e.g., a field programmable gate array (FPGA), an application specific integrated circuit (ASIC), etc.), or other suitable processor. The memory system controller 106 can include a processor 120 (processing device) configured to execute instructions stored in local memory 122. In the illustrated example, the local memory 122 of the memory system controller 106 includes an embedded memory configured to store instructions for performing various processes, operations, logic flows, and routines that control operation of the memory system 102, including handling communications between the memory system 102 and the host system 108. In some embodiments, the local memory 122 can include memory registers storing, e.g., memory pointers, fetched data, etc. The local memory 122 can also include read-only memory (ROM) for storing micro-code. While the example memory system 102 in FIG. 1 has been illustrated as including the memory system controller 106, in another embodiment of the present disclosure, a memory system may not include a memory system controller, and may instead rely upon external control (e.g., provided by an external host, or by a processor or controller separate from the memory system).

The media devices 104A to 104N can include media controllers 121A to 121N to create a data structure that includes programming start voltages for the media devices 104A to 104N. In some embodiments, the data structure is a list (hereinafter referred to as a "block list" or "memory-block list"). The memory-block list is described in greater detail below in conjunction with FIG. 2. The memory-block list can store the start voltages that can be used in writing/programming to the corresponding block streams. Each of the block streams can represent a set/sequence of write/programming operations that occur to a corresponding block, word line, or a combination thereof. In some embodiments, one memory-block list can store the start voltages of one of the memory devices 104A to 104N. In some embodiments, one memory-block list can store the start voltages for more than one or all of the memory device 104A to 104N.

The memory system 102 can include a start-voltage management component 113 to track and manage a set of start voltages (e.g., instances of the programming start voltage for a set of block-word line combinations). In one embodiment, the memory system controller 106 includes the start-voltage management component 113. For example, the memory system controller 106 can include a processor 120 (processing device) configured to execute instructions stored in local memory 122 for tracking and managing a set of start voltages. The start-voltage management component 113 can determine whether the memory-block list has reached maximum capacity and/or near maximum capacity, and can free up capacity for storing new start-voltage values, as described in greater detail below.

Figure 2:
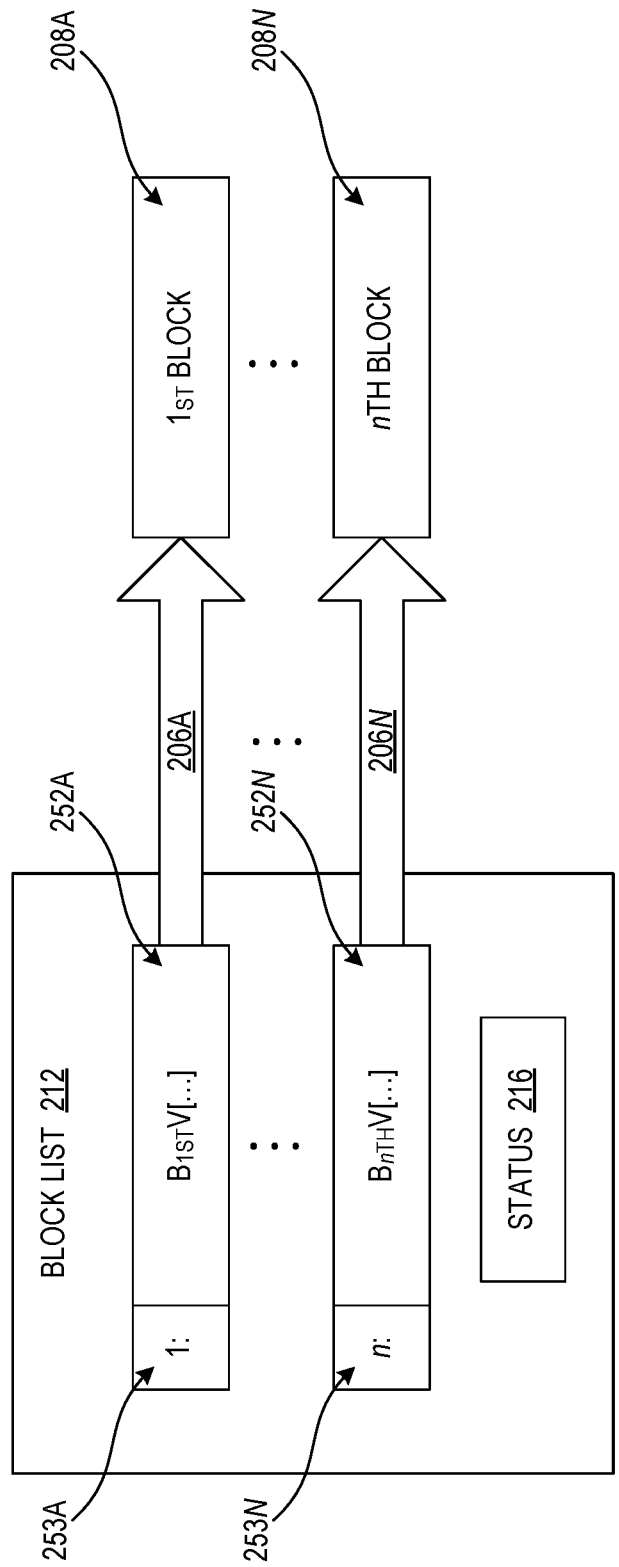
FIG. 2 illustrates a block diagram of an example of monitoring capacity in a memory-block list, in accordance with some embodiments of the present disclosure.

FIG. 2 illustrates a block diagram of an example of monitoring capacity in a memory-block list, in accordance with some embodiments of the present disclosure. The memory-block list 212 can store a set of the start voltages 252A-252N for the most recently accessed memory blocks/word lines. For example, starting from an empty list (e.g., such as at memory system start up or after a reset event), one or more of the memory devices 104A-104N can determine the programming start voltage (e.g., programming start voltage 252A) when writing/programming to a memory location for the first time. When a programming start voltage (e.g., programming start voltage 252A) is determined, the respective memory device 104 can store it in the memory-block list 212. As the memory device 104 performs the write/programming operation for the first time on different memory blocks, the memory device 104 can similarly determine and store the start voltages 252A-252N in the memory-block list 212.

The memory-block list 212 can include slots/registers for storing the start voltage values 252A-252N. Each entry for a start voltage value 252 can include an index identifier 253A-253N. The start voltage values 252A-252N can be represented as "$B_{1st}V[\ldots]$", which includes a start voltage value for a first memory block, "$B_{nth}V[\ldots]$", which includes a start voltage value for an nth memory block. Each start voltage value entry in the memory-block list 212 can be used for programming a corresponding block stream 206A-206N. Each of the block streams 206A-206N can represent a set/sequence of write/programming operations that occur for a corresponding block (e.g., block 208A-208N), word line, or a combination thereof.

The memory-block list 212 can have a maximum capacity (e.g., maximum storage capacity) for storing start voltages. The maximum capacity can correspond to a maximum number of blocks/word lines that can be tracked at one time. For example, the memory-block list 212 can have the maximum capacity of 'n', such as for tracking the start voltages 252A-252N corresponding to n different memory blocks.

The memory-block list 212 can include one or more status indicators (e.g., status 216) indicating when the memory-block list 212 meets one or more thresholds. In some embodiments, a threshold is set to match to the maximum capacity. In some embodiments, a threshold is set to less than the maximum capacity (e.g., n–1). The threshold can be pre-defined and/or user configurable. In some embodiments, the start-voltage management component 113 uses the status indicator 216 to detect when the memory-block list 212 is nearing maximum capacity and/or has reached maximum capacity and can modify the memory-block list 212 to free up capacity in order to store one or more new start-voltages, for subsequent corresponding write/programming operations, in the memory-block list 212.

Modifying the memory-block list 212 to free capacity and store the start voltages 252A-252N of the most recently accessed/written/programmed blocks provides simplified memory device start voltage management of multiple streams in a memory system 102. Accordingly, the start-voltage management component 113 can help maintain maximum $T_{prog}$ performance when faced with multiple open-block streams that require reduced firmware overhead. Based on tracking the most-recently used open block streams, the start-voltage management component 113 can use the memory-block list 212 to track the blocks that have higher likelihood of subsequent access, thereby increasing the performance gain further.

Figure 3:
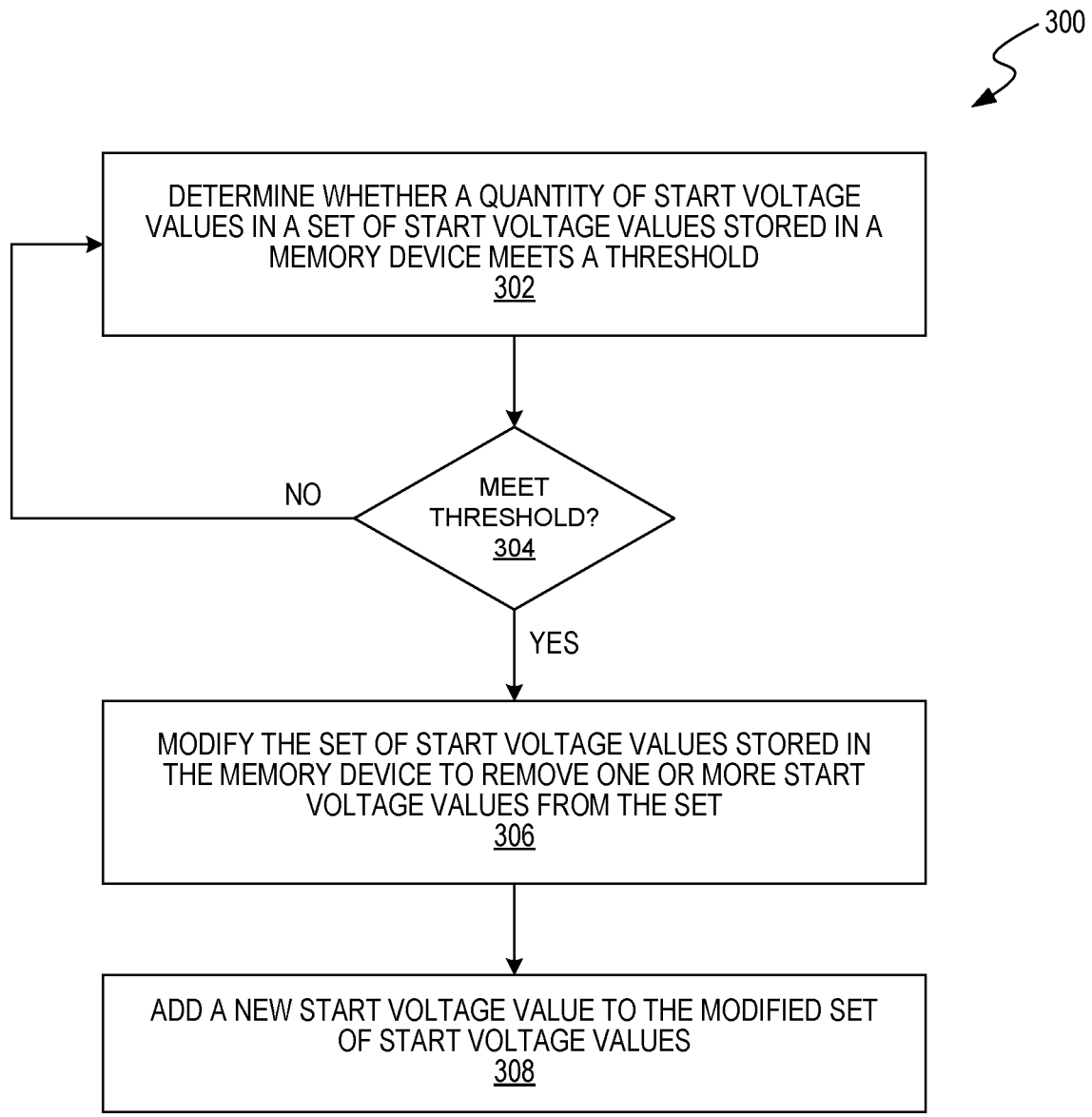
FIG. 3 is a flow diagram illustrating example method for managing storage capacity of start-voltages, in accordance with an embodiment of the present disclosure.

FIG. 3 is a flow diagram illustrating example method 300 for managing storage capacity of start-voltages. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the start-voltage management component 113 of FIG. 1.

At block 302, the processing device determines whether a quantity of start voltage values in a set of start voltage values stored in a memory device meets a threshold. In some embodiments, the threshold is set to match to the maximum capacity. In some embodiments, the threshold is set to less than the maximum capacity (e.g., n–1). The threshold can be pre-defined and/or user configurable. The determination of whether the quantity of start voltage values in the set of voltage values meets a threshold can be triggered based on timing, recognition of event/input conditions, etc. The determination can be triggered autonomously, i.e., without any command or interactions from other external components/devices. In some embodiments, the determination is triggered by a process, a set of instructions, hardware or circuits, etc. configured to implement a time-based event driven cadence, such as for a watchdog cadence timer mechanism. For example, the time-based event driven cadence can be based on a set duration/frequency for checking occupancy/availability status of the memory-block list 212 of FIG. 2.

In some embodiments, the determination is triggered by a process, a set of instructions, hardware or circuits, etc. configured to implement an event-based cadence. For example, the processing device can check the occupancy/availability status of the memory-block list 212 just prior to the first program within a freshly opened block. In other words, the processing device can check the occupancy/availability status whenever a memory block becomes open, such as after an erase operation, after garbage collection, etc. Also for example, the processing device can check the occupancy/availability status of the memory-block list 212 whenever the processing device sends a write/programming command to the memory devices 104A-104N.

The processing device can make the determination by accessing/reading the memory-block list 212. For example, the processing device can read the memory-block list 212 to determine whether any of the slots/registers in the memory-block list 212 are empty, such as including a predetermined value or not including any value.

In some embodiments, the processing device can use a check status command to read the memory-block list 212. The check status command can include a preexisting or preconfigured command/instruction for operating/accessing the memory-block list 212. For example, the check status command can correspond to an existing Get Feature 0xDC function included in an auto dynamic word line start voltage (ADWLSV) mechanism implemented in the memory devices 104A-104N. The ADWLSV mechanism and/or its function can autonomously (e.g., without any initiating and maintaining commands/instructions from outside of the memory devices 104A-104N) determine and store the start voltages 252A-252N.

When the number of the slots/registers in the memory-block list 212 that are storing an instance of the programming start voltages 252A-N meets the threshold, the processing device can update the one or more status indicators 216. For example, there may be one status indicator for a threshold that is set to the maximum capacity (e.g., n) of the memory-block list 212. When all of the slots/registers in the memory-block list 212 that are storing an instance of the programming start voltages 252A-N meets the threshold (e.g., maximum capacity threshold), the processing device can set the respective status indicator as valid or true. In another example, there may be a threshold that is set to less than the maximum capacity (e.g., n−1) of the memory-block list 212. When the number of slots/registers in the memory-block list 212 that are storing an instance of the programming start voltages 252A-N meets the threshold (e.g., less than maximum capacity threshold), the processing device can set the respective status indicator as valid or true. In some embodiments, there is a threshold set to the maximum capacity of the memory-block list 212 and an additional threshold set to less than the maximum capacity (e.g., n−1) of the memory-block list 212. Referring to FIG. 3, at block 304, if a determination is made that the quantity of start voltage values in a set of start voltage values does not meet the threshold, the processing device makes another determination when triggered at block 302, for example, based on a time based cadence and/or an event based cadence. Accordingly, the memory devices 104A-104N can continue operations including determining the programming start voltage 252A-252N for newly opened or newly targeted memory blocks/word lines, and storing the newly determined programming start voltage(s) 252A-252N in the memory-block list 212.

At block 304, if a determination is made that the quantity of start voltage values in a set of start voltage values meets the threshold, the processing device modifies the set of start voltage values stored in the memory device at block 306. The processing device can modify the set of start voltage values stored in the memory-block list 212 of the memory device. The processing device can modify the set of start voltage values, for example, by removing one or more of the start voltage values 252A-252N stored in the memory-block list 212.

Figure 4A:
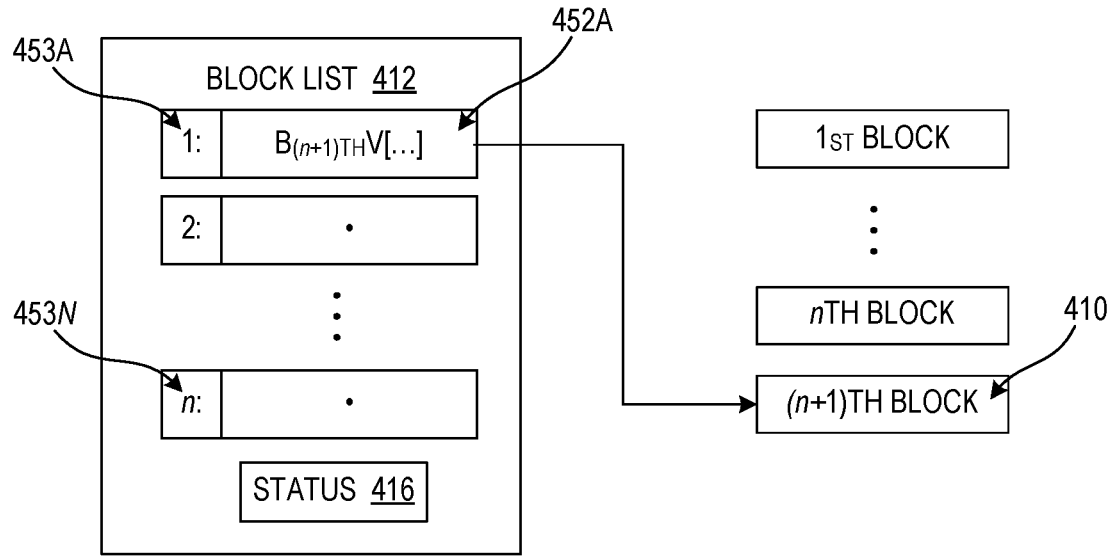
FIGS. 4A and 4B illustrate block diagrams of examples of freeing capacity in a memory-block list for start voltage values, in accordance with some embodiments of the present disclosure.
Figure 4B:
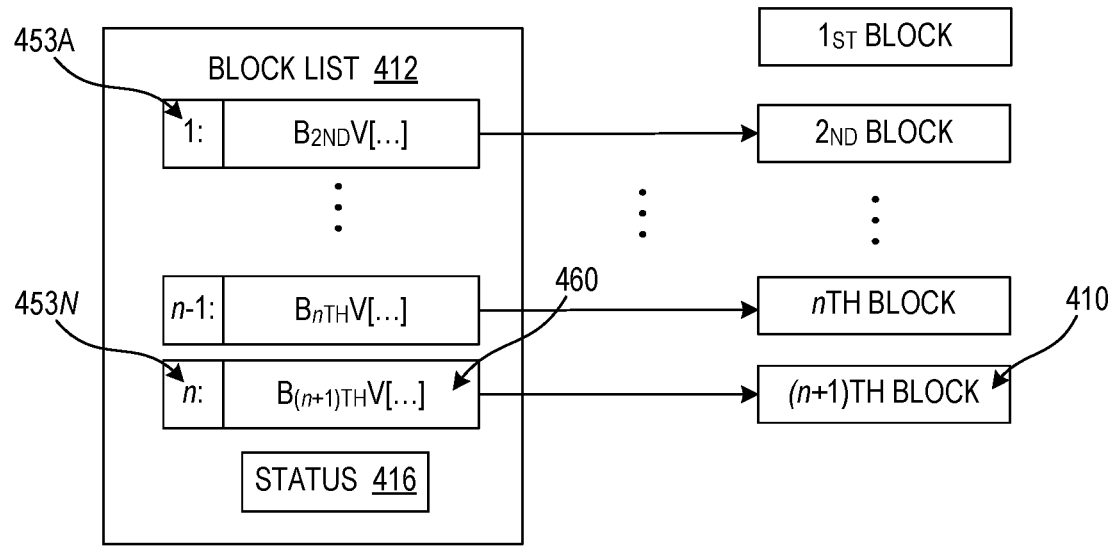

FIGS. 4A-4B illustrate block diagrams of examples of freeing capacity in a memory-block list for start voltage values, in accordance with some embodiments of the present disclosure. For example, the memory system controller 106 may command memory device 104A to perform the write/programming operation on the (n+1)th memory block 410 after the memory-block list 412 has reached the maximum capacity of n different start voltages. In such cases, the start-voltage management component 113 can manage the memory-block list 312 to free up capacity in the memory-block list 212 in order to add a new start-voltage corresponding to the write/programming operation on the (n+1)th memory block. The start-voltage management component 113 can, for example, erase one or more of the previously stored start voltages (e.g., one or more of n−1 start voltages) in the memory-block list 412 in order to store the start voltage for the (n+1)th memory block 410.

In some embodiments, such as illustrated in FIG. 4A, the start-voltage management component 113 can clear or reset the memory-block list 412 based on removing the previously stored start voltages. The start-voltage management component 113 can reset the memory-block list 412 based on the status 416 with or without receiving an additional write/programming request to a new block. Once the memory-block list 412 is clear, the memory device 104 can determine the programming start voltage for the additional (e.g., the (n+1)th) block associated with the new/incoming write/programming request, and the start-voltage management component 113 can store the programming start voltage 452A for the additional (e.g., the (n+1)th) block in the register corresponding to entry identifier 452A.

In some embodiments, such as illustrated in FIG. 4B, the start-voltage management component 113 can update the memory-block list 412 based on removing the oldest instance of the start voltages. For example, the memory-block list 412 can be implemented using a first-in first-out (FIFO) memory structure (e.g., buffer). As illustrated in FIG. 4B, the start-voltage management component 113 can drop or erase the first/oldest instance of the start voltage (e.g., $B_{1st}V[\ldots]$ 252A in FIG. 2) previously listed in register 1 based on receiving a write/programming request involving the (n+1)th block. In some embodiments, the start-voltage management component 113 can shift the remaining start voltages, such that the oldest value (e.g., $B_{2nd}V[\ldots]$) is always stored at a designated register (e.g., register 1) corresponding to an oldest entry identifier 453A. The newest start voltage 460, such as for the (n+1)th block 410, can also be stored at another designated register (e.g., register n 453N). In some embodiments, the start-voltage management component 113 can shift according to write/programming access, such as by having the start voltage for a most-recently accessed memory location at a top/bottom of the list and having the other start voltages sorted accordingly.

In some embodiments, the memory-block list 312 is implemented using a circular buffer, and the start-voltage management component 113 uses the oldest entry identifier 453A (e.g., a pointer or an index) to track the oldest/newest entry in the list. According to the oldest entry identifier 453A, the start-voltage management component 113 can write/program over the oldest entry with the newest start voltage and then shift the oldest entry marker 453A accordingly.

In some embodiments, the start-voltage management component 113 can include timers that each track a duration since the last write/programming access to the corresponding memory location (e.g., last activity for the corresponding open block stream). The start-voltage management component 113 can use the timer values to determine the oldest entry.

The start-voltage management component 113 can remove the one or more of the start voltage values as discussed above. For example, in some embodiments, the start-voltage management component 113 can update the memory-block list 412 based on clearing the memory-block list 412. For example, the start-voltage management component 113 can clear/reset the memory-block list 412 and remove one or more (e.g., all) of values stored therein. The start-voltage management component 113 can clear the memory-block list 412 using a reset list command (e.g., an existing Set Feature 0xDC for the ADWLSV mechanism). In some embodiments, the start-voltage management component 113 can update the memory-block list 412 based on removing/replacing an oldest of the start voltages in the memory-block list 412. For example, the start-voltage management component 113 can trigger the update when a new instance (e.g., the (n+1)th) of the start voltage is determined.

Referring to FIG. 3, at block 308, the processing device adds a new start voltage values to the modified set of start voltage values in the memory device. The processing device can store the new instance of the start voltage in the space/resource previously occupied by the oldest entry. For example, the processing device can store the new start voltage according to the oldest entry marker, and then update the oldest entry marker.

In some embodiments, the processing device causes a dummy operation (e.g., dummy read operation) to be executed. The dummy operation can include an operation that is autonomously triggered/initiated by the memory device without any host command/interaction. The dummy operation can be utilized to finalize a process/a sequence, such as for finalizing an update process of the memory-block list 412.

The processing device can perform and/or trigger a memory device 104 to perform a dummy read that includes one or more autonomously triggered/initiated read operations. In some embodiments, the dummy read can be performed in accordance with a ADWLSV mechanism on the memory device 104. In some embodiments, the memory cells to be read for the dummy read operation are selected at random. In some embodiments, a predetermined set of the memory cells are read for the dummy read operation. In some embodiments, the dummy read can include reading from one of the open block streams (e.g., the stream corresponding to the newest programming start voltage). The processing device and/or memory device 104 can ignore or discard results of the dummy read.

Figure 5:
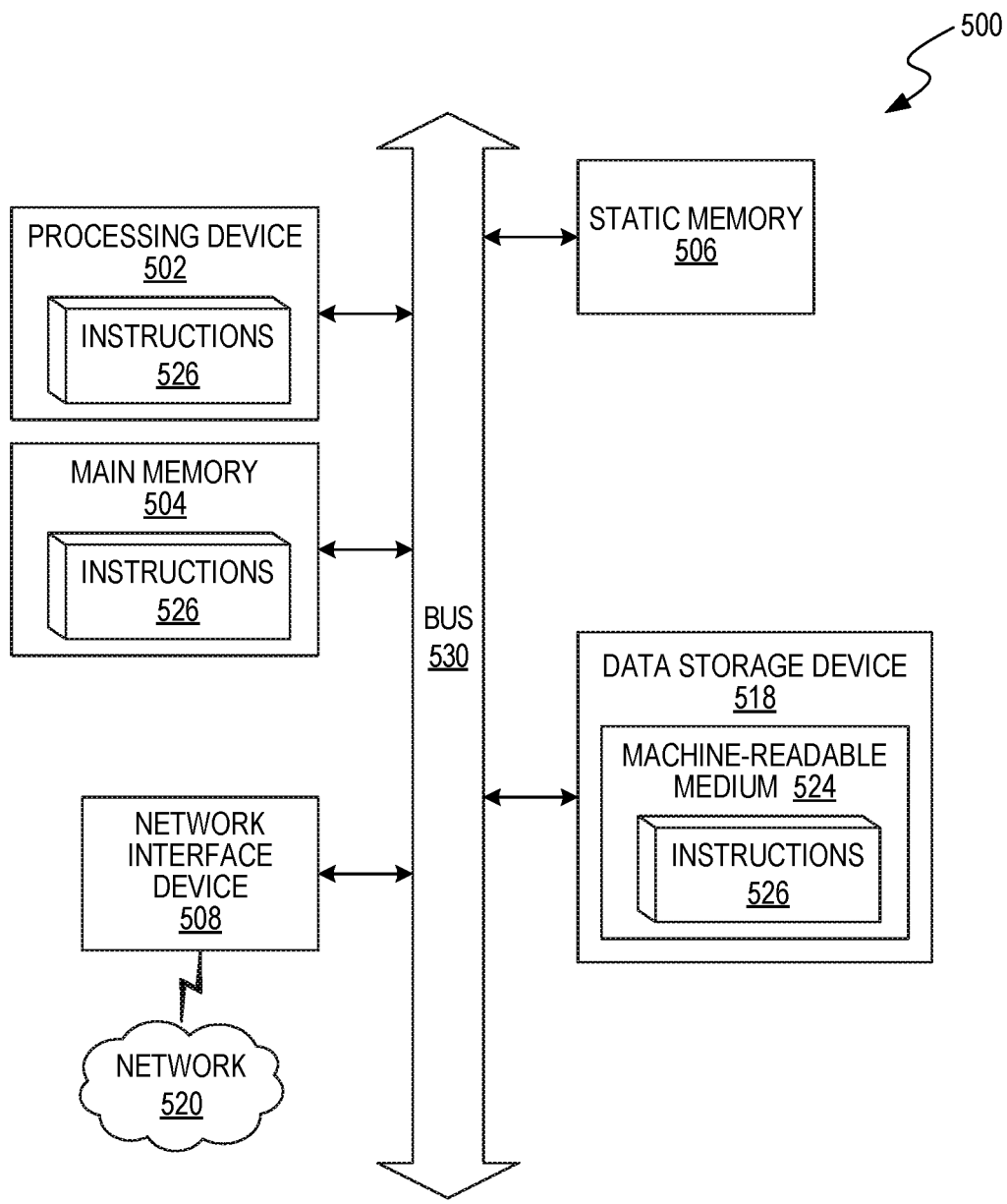
FIG. 5 is a block diagram of an example computer system in which implementations of the present disclosure may operate.

FIG. 5 illustrates an example machine of a computer system 500 within which a set of instructions, for causing the machine to perform any one or more of the methodologies discussed herein, may be executed. For example, the computer system 500 may correspond to a host system (e.g., the host system 108 of FIG. 1) that includes or utilizes a storage system (e.g., the memory system 102 of FIG. 1) or may be used to perform the operations of a controller (e.g., to execute an operating system to perform operations corresponding to the start-voltage management component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 may further include a network interface device 508 to communicate over the network 520.

The data storage device 518 may include a machine-readable storage medium 524 (also known as a computer-readable medium) on which is stored one or more sets of instructions or software 526 embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media. The machine-readable storage medium 524, data storage device 518, and/or main memory 504 may correspond to the memory system 102 of FIG. 1.

In one implementation, the instructions 526 include instructions to implement functionality corresponding to a programming component (e.g., start-voltage management component 113 of FIG. 1). While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, aspects of the present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

The term "processing" as used includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

We claim:

1. A system, comprising:
a memory device storing a set of start voltage values, wherein:
each value in the set represents a voltage level used to initially store charges in performing operations to corresponding one or more memory locations of the memory device, and
values in the set are stored according to a sequence; and
a processing device, operatively coupled to the memory device, to:
determine whether a total number of start voltage values in the set of start voltage values meets a threshold number that corresponds to a maximum capacity (n) for the set of start voltage values, wherein n is less than a total number of memory blocks, word lines, or a combination thereof in the memory device; and
modify the set of start voltage values stored in the memory device to remove one or more start voltage values from the set according to the sequence in response to the determination that the total number of start voltage values in the set meets the threshold number.

2. The system of claim 1, wherein to determine whether the total number of start voltage values in the set of start voltage values meets the threshold number is triggered according to a predetermined cadence.

3. The system of claim 1, wherein to determine whether the total number of start voltage values in the set of start voltage values meets the threshold number is triggered when a memory block becomes open and before a first operation to the opened memory block.

4. The system of claim 1, wherein the processing device is configured further to perform a dummy operation after modifying the set of start voltage values.

5. The system of claim 1, wherein the processing device is configured to:
determine whether the total number of start voltage values in the set of start voltage values meets the threshold number using auto dynamic word line start voltage (ADWLSV) of the memory device; and
remove the one or more of the start voltage values using a set feature function of ADWLSV.

6. The system of claim 1, wherein the processing device is configured to remove the one or more of the start voltage values based on resetting a memory-block list to clear the stored set of start voltage values.

7. The system of claim 1, wherein:
the sequence for the values in the set corresponds to a most recently accessed or programmed set of blocks; and
the processing device is configured to remove the one or more start voltage values that correspond to one or more of the memory blocks, word lines, or a combination thereof having longest delay since last access or charging operation.

8. The system of claim 7, wherein the set of start voltage values are stored using a circular buffer.

9. The system of claim 1, wherein:
the sequence for the values in the set corresponds to an order in which the values were added to the set; and
the processing device is configured to remove an oldest value in the set.

10. The system of claim 1, wherein:
the memory device comprises a negative-and (NAND) die;
the set of start voltage values are stored in the NAND die;
each value in the set corresponds to a memory block in the NAND die; and
the threshold number is less than a total number of memory blocks in the NAND die.

11. The system of claim 1, wherein the start voltage values correspond to multiple block streams, wherein each block stream is a set of data and/or charge operations that is scheduled for a corresponding block of the memory device, word line of the memory device, or a combination thereof.

12. The system of claim 1, wherein the processing device is configured to perform operations based on iteratively storing charges in targeted memory cells according to an incremental step pulse programming (ISPP) mechanism, wherein:
  a first charging iteration for the ISPP mechanism charges according to one of the start voltage values that corresponds to targeted memory cells, and
  the start voltage values are each for reducing a number of iterations to complete the respective operation.

13. A method comprising:
  storing start voltage values in a data structure, wherein:
    the data structure has a maximum capacity corresponding to a maximum number (n) of start voltage values storable in the data structure, wherein n is less than a total number of memory blocks, word lines, or a combination thereof, and
    the start voltage values each represent a voltage level used to initially store charges to a subset of memory cells in writing or programming to the subset of memory cells, wherein the subset of memory cells correspond to one of the memory blocks, one of the word lines, or a combination thereof;
  determining that a total number of the start voltage values stored in the data structure reaches the maximum capacity;
  removing one or more of the start voltage values in the data structure to maintain a set of the start voltage values corresponding to a set of most recently accessed memory blocks, word lines, or a combination thereof; and
  storing a new start voltage value to the data structure after the removal.

14. The method of claim 13, wherein determining that the total number of the start voltage values stored in the data structure reaches the maximum capacity comprises checking capacity of the data structure according to a predetermined cadence.

15. The method of claim 13, wherein determining that the total number of the start voltage values stored in the data structure reaches the maximum capacity checking capacity of the data structure when a memory block becomes open and before a first write operation to the opened memory block.

16. The method of claim 13, wherein storing the start voltage values, determining that the total number of the start voltage values reaches the maximum capacity, removing the one or more of the start voltage values, storing the new start voltage value, or a combination thereof includes storing the start voltage values, determining that the total number of the start voltage values reaches the maximum capacity, removing the one or more of the start voltage values, storing the new start voltage value, or a combination thereof without a command or an interaction from a host device.

17. A method, comprising:
  determining whether a total number of start voltage values in a set of start voltage values stored in a memory device meets a threshold number, wherein:
    each start voltage value in the set represents a voltage level used to initially store charges in performing operations to corresponding one or more blocks, word lines, or a combination thereof of the memory device, and
    the threshold number corresponds to a maximum capacity (n) for the set of start voltage values, wherein n is less than a total number of memory blocks, word lines, or a combination thereof in the memory device;
  modifying the set of start voltage values stored in the memory device to remove one or more start voltage values from the set in response to a determination that the total number of start voltage values in the set meets the threshold number; and
  adding a new start voltage value to the modified set of start voltage values.

18. The method of claim 17, wherein determining whether the total number of start voltage values in the set of start voltage values meets the threshold number is triggered according to a predetermined cadence.

19. The method of claim 17, wherein to determining whether the total number of start voltage values in the set of start voltage values meets the threshold number is triggered when a memory block becomes open and before a first operation to the opened memory block.

20. The method of claim 17, further comprising performing a dummy operation after modifying the set of start voltage values.

21. The method of claim 17, wherein to remove the one or more of the start voltage values is based on resetting a memory-block list to clear the stored set of start voltage values.

22. The method of claim 17, wherein:
  the set of start voltage values are stored using a circular buffer; and
  the method further comprising track the oldest entry that was stored first amongst the start voltage values.

23. The method of claim 17, wherein the start voltage values correspond to multiple block streams, wherein each block stream is a set of data and/or charge operations that is scheduled for a corresponding block of the memory device, word line of the memory device, or a combination thereof.

24. A non-transitory computer-readable storage medium comprising instructions that, when executed by a processing device, cause the processing device to:
  determine whether a total number of start voltage values in a set of start voltage values stored in a memory device meets a threshold number, wherein:
    each start voltage in the set represents a voltage level used to initially store charges in performing operations to corresponding one or more blocks, word lines, or a combination thereof of the memory device, and
    the threshold number corresponds to a maximum capacity (n) for the set of start voltage values, wherein n is less than a total number of memory blocks, word lines, or a combination thereof in the memory device;
  modify the set of start voltage values stored in the memory device to remove one or more start voltage values from the set in response to a determination that the total number of start voltage values in the set meets the threshold number; and
  add a new start voltage value to the modified set of start voltage values.

25. The non-transitory computer-readable storage medium of claim 24, wherein to determine whether the total number of start voltage values in the set of start voltage values meets the threshold number is triggered according to a predetermined cadence.

26. The non-transitory computer-readable storage medium of claim 24, wherein to determine whether the total number of start voltage values in the set of start voltage values meets the threshold number is triggered when a memory block becomes open and before a first operation to the opened memory block.

27. The non-transitory computer-readable storage medium of claim 24, wherein the processing device is further to perform a dummy operation after modifying the set of start voltage values.

28. The non-transitory computer-readable storage medium of claim 24, wherein to remove the one or more of the start voltage values is based on resetting a memory-block list to clear the stored set of start voltage values.

29. The non-transitory computer-readable storage medium of claim 24, wherein:
   the set of start voltage values are stored using a circular buffer; and
   the processing device is further to track an oldest entry that was stored first amongst the start voltage values.

* * * * *